United States Patent
Shin et al.

(10) Patent No.: US 7,994,056 B2
(45) Date of Patent: Aug. 9, 2011

(54) METHOD FOR FORMING PATTERN IN SEMICONDUCTOR DEVICE

(75) Inventors: Jong-Han Shin, Ichon-shi (KR); Hyung-Soon Park, Ichon-shi (KR); Cheol-Hwi Ryu, Ichon-shi (KR); Jum-Yong Park, Ichon-shi (KR); Sung-Jun Kim, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 739 days.

(21) Appl. No.: 11/965,582

(22) Filed: Dec. 27, 2007

(65) Prior Publication Data

US 2009/0117739 A1    May 7, 2009

(30) Foreign Application Priority Data

Nov. 2, 2007    (KR) .................. 10-2007-0111765

(51) Int. Cl.
*H01L 21/301*    (2006.01)
*H01L 21/461*    (2006.01)
*H01L 21/311*    (2006.01)
*C03C 15/00*    (2006.01)
*C03C 25/68*    (2006.01)
*C23F 1/00*    (2006.01)

(52) U.S. Cl. ........ 438/690; 438/689; 438/700; 438/703; 216/41

(58) Field of Classification Search ............... 438/690
See application file for complete search history.

(56) References Cited

U.S. PATENT DOCUMENTS

| 6,750,127 | B1* | 6/2004 | Chang et al. | 438/585 |
| 6,835,662 | B1* | 12/2004 | Erhardt et al. | 438/689 |
| 2006/0046484 | A1* | 3/2006 | Abatchev et al. | 438/689 |
| 2006/0105506 | A1* | 5/2006 | Shen | 438/149 |
| 2008/0081461 | A1* | 4/2008 | Lee et al. | 438/637 |

FOREIGN PATENT DOCUMENTS
KR    1020070058578 A    6/2007

* cited by examiner

*Primary Examiner* — Nadine G Norton
*Assistant Examiner* — Stephanie Duclair
(74) *Attorney, Agent, or Firm* — Kilpatrick Townsend & Stockton LLP

(57) ABSTRACT

A method for forming a pattern in a semiconductor device includes forming an etch-target layer over a substrate, wherein the substrate includes a first region having a smaller pattern than the first region, forming a sacrificial layer and a passivation layer over the etch-target layer, etching the passivation layer and the sacrificial layer to form stack structures including a sacrificial pattern and a passivation pattern, forming spacers over sidewalls of the stack structures, forming a mask pattern covering the second region, removing a portion of the passivation pattern in the first region exposed by the mask pattern to expose a portion of the sacrificial pattern in the first region, removing the exposed portion of the sacrificial pattern in the first region, and etching the etch-target layer to form an etch-target pattern using the spacers in the first and second regions and the stack structure formed between the spacers in the second region.

13 Claims, 4 Drawing Sheets

METHOD FOR FORMING PATTERN IN SEMICONDUCTOR DEVICE

CROSS-REFERENCE TO RELATED APPLICATIONS

The present invention claims priority of Korean patent application number 2007-0111765, filed on Nov. 2, 2007, which is incorporated by reference in its entirety.

BACKGROUND OF THE INVENTION

The present invention relates to a method for fabricating a semiconductor device, and more particularly, to a method for forming a pattern in a semiconductor device.

As semiconductor devices have become highly integrated, pattern micronization is generally required. Yet, it is difficult to embody a device having a micro pattern of 40 nm or less due to resolution limitations of currently developed photo-exposure apparatuses.

In order to overcome such limitations, a double patterning technology and a spacer patterning technology have been recently introduced. The double patterning technology includes forming a micro pattern by performing a photolithography process two times. The spacer patterning technology includes patterning using spacers.

In particular, the spacer patterning technology is appraised to be more improved than the double patterning technology because the spacer patterning technology overcame the lack of overlay margin which was a technological weak point of the double patterning technology.

The spacer patterning technology may largely be divided into a positive spacer patterning technology and a negative spacer patterning technology. The positive spacer patterning technology includes using spacers as a direct mask in a pattern formation process. The negative spacer patterning technology includes using space between spacers.

For instance, the positive spacer patterning technology includes forming an etch stop layer and a sacrificial layer over an etch-target layer. A photoresist pattern is formed over the sacrificial layer, the photoresist pattern having a pitch greater than a photo-exposure pitch limit. The sacrificial layer is etched using the photoresist pattern to form a sacrificial pattern. Spacers are formed on both sides of the sacrificial pattern.

The sacrificial pattern is then removed. The etch stop layer and the etch-target layer are etched using the remaining spacers. Thus, an etch-target pattern having a value of a photo-exposure pitch limit or less may be formed.

Meanwhile, the negative spacer patterning technology includes forming an etch stop layer and a sacrificial layer over an etch-target layer. A photoresist pattern is formed over the sacrificial layer, the photoresist pattern having a value of a photo-exposure pitch limit or greater. The sacrificial layer is etched using the photoresist pattern to form a sacrificial pattern. Spacers are formed on both sides of the sacrificial pattern.

A capping layer is formed over the resultant structure including the sacrificial pattern and the spacers. A planarization process is performed on the structure until the spacers are exposed. Thus, a capping pattern filled between the spacers is formed. The spacers are then removed. The etch stop layer and the etch-target layer are etched using the remaining sacrificial pattern and the capping pattern. Thus, an etch-target pattern having a value of a photo-exposure pitch limit or less may be formed.

The positive spacer patterning technology or the negative spacer patterning technology is selectively used when forming a pattern in a semiconductor device. However, the semiconductor device may not include uniformly sized patterns. It is highly likely that the semiconductor device includes both a region where patterns having a small width are formed, e.g., a cell region, and another region where patterns having a relatively large width are formed, e.g., a peripheral region.

Thus, selectively using one of the positive spacer patterning technology and the negative spacer patterning technology when forming a pattern in a semiconductor device may bring about disadvantages as well as merits.

For instance, when forming gate patterns in a cell region and a peripheral region using the positive spacer patterning technology, the gate patterns in the cell region are formed densely in an even number. Thus, the gate patterns may be formed with ease using an even number of spacers formed on both sides of sacrificial patterns.

However, gate patterns in the peripheral region have a relatively large width than those in the cell region. Thus, it is difficult to form the gate patterns solely using spacers. An additional mask process is generally required, and thus, an overlay limitation, similar to that often occurring in the double patterning technology, may be generated.

Meanwhile, when forming gate patterns in a cell region and a peripheral region using the negative spacer patterning technology, it may be easier to form gate patterns in the peripheral region having a relatively large width than those in the cell region because the gate patterns are formed using spaces between spacers. However, one of the gate patterns has to be removed because an odd number of gate patterns are formed in the cell region, causing difficulty in the process.

SUMMARY OF THE INVENTION

Embodiments of the present invention are directed to provide a method for forming a pattern in a semiconductor device, which can improve process precision and simplify the process by using a positive spacer patterning technology in a region where patterns have a small size while using a negative spacer patterning technology in a region where patterns have a large size.

In accordance with an embodiment of the present invention, there is provides a method for forming a pattern in a semiconductor device. The method includes forming an etch-target layer over a substrate, wherein the substrate includes a first region where the size of pattern is small and a second region where the size of pattern is larger than that in the first region, forming a sacrificial layer and a passivation layer over the etch-target layer, etching the passivation layer and the sacrificial layer to form stack structures including a sacrificial pattern and a passivation pattern, forming spacers over sidewalls of the stack structures, forming a mask pattern covering the second region, removing a portion of the passivation pattern in the first region exposed by the mask pattern to expose a portion of the sacrificial pattern in the first region, removing the exposed portion of the sacrificial pattern in the first region, and etching the etch-target layer to form an etch-target pattern using the spacers in the first and second regions and the stack structure formed between the spacers in the second region.

DESCRIPTION OF SPECIFIC EMBODIMENTS

Embodiments of the present invention relate to a method for forming a pattern in a semiconductor device.

In accordance with an embodiment of the present invention, process precision is improved and the process is simplified by using a positive spacer patterning technology in a region where patterns have a small size while using a negative spacer patterning technology in a region where patterns have a large size.

FIGS. 1A to 1H illustrate cross-sectional views of a method for forming a pattern in a semiconductor device in accordance with an embodiment of the present invention. This embodiment assumes that etch-target patterns having a first line width W1 (FIGS. 1C and 1H) are required to be formed in a first region where patterns have a small size, and other etch-target patterns having a second line width W2 (FIGS. 1C and 1H) are required to be formed in a second region where patterns have a larger size than those in the first region, wherein the second line width W2 is larger than the first line width W1.

For instance, the first region may correspond to a cell region and the second region may correspond to a peripheral region in a dynamic random access memory (DRAM) device. Also, the first region may correspond to a region where a plurality of memory cells are to be formed and the second region may correspond to another region where a select transistor is to be formed in a flash memory device.

Figure 1A:
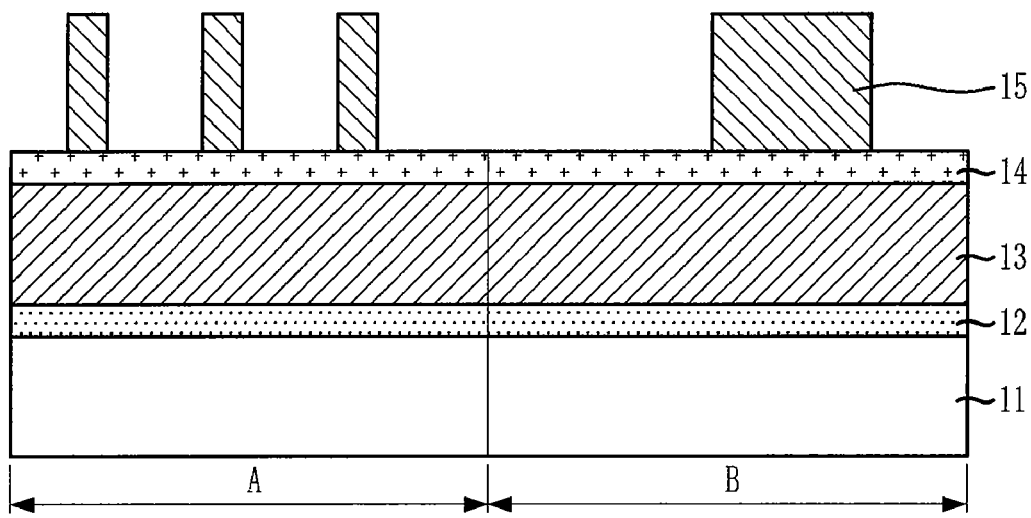
FIGS. 1A to 1H illustrate cross-sectional views of a method for forming a pattern in a semiconductor device in accordance with an embodiment of the present invention.

Referring to FIG. 1A, an etch-target layer (not shown) is formed over a substrate (not shown). The substrate includes a first region A where the size of patterns is small and a second region B where the size of patterns is larger than that in the first region A.

A hard mask 11 is formed over the etch-target layer. The hard mask 11 functions as an etch barrier during a subsequent etch-target layer etching process. The hard mask 11 may include one of an oxide-based layer, an amorphous carbon layer, and a nitride-based layer. For instance, the hard mask 11 is formed to a thickness ranging from approximately 1,000 Å to approximately 5,000 Å.

An etch stop layer 12 is formed over the hard mask 11. The etch stop layer 12 is formed to stop etch during a subsequent sacrificial layer etching process or a subsequent spacer etching process. For instance, the etch stop layer 12 includes a silicon oxynitride (SiON) layer formed to a thickness ranging from approximately 500 Å to approximately 2,000 Å.

A sacrificial layer 13 and a passivation layer 14 for protecting the sacrificial layer 13 are formed over the etch stop layer 12. For instance, the sacrificial layer 13 includes one of a polysilicon layer and an oxide-based layer. The sacrificial layer 13 is formed to a thickness ranging from approximately 1,000 Å to approximately 3,000 Å. Also, the passivation layer 14 includes a nitride-based layer or an amorphous carbon layer formed to a thickness ranging from approximately 100 Å to approximately 1,000 Å.

A photoresist pattern 15 is formed over the passivation layer 14. The photoresist pattern 15 has line widths corresponding to line widths of a desired etch-target pattern. The line widths of the desired etch-target pattern are shown with a first line width W1 and a second line width W2 in FIGS. 1C and 1H.

In more detail, the line width of the photoresist pattern 15 in the first region A is substantially the same as the first line width W1 of the desired etch-target pattern to be formed in the first region A. A space width of the photoresist pattern 15 in the first region A may be approximately twice as large as a space width of the desired etch-target pattern to be formed in the first region A.

Meanwhile, the line width of the photoresist pattern 15 in the second region B may be smaller than the second line width W2 of the desired etch-target pattern to be formed in the second region B by a thickness of subsequent spacers.

Figure 1B:
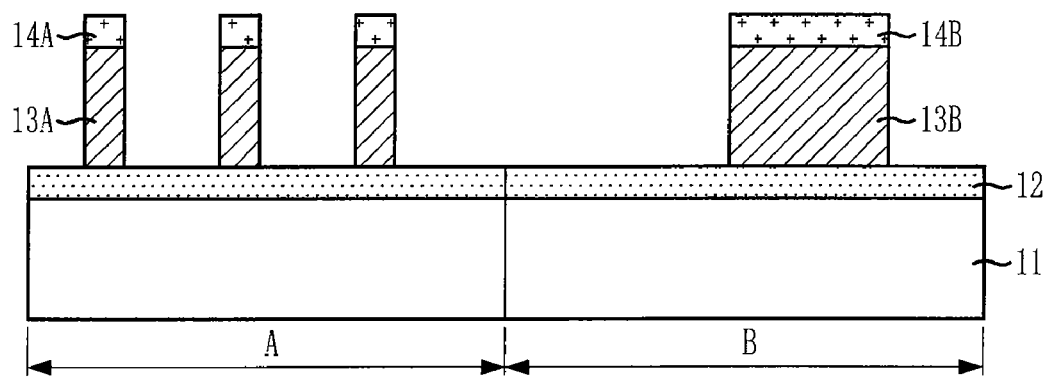

Referring to FIG. 1B, the passivation layer 14 and the sacrificial layer 13 are etched using the photoresist pattern 15 as an etch mask. Thus, stack structures including remaining portions of the sacrificial layer 13 and the passivation layer 14 are formed.

Hereinafter, the remaining portions of the sacrificial layer 13 in the first region A are referred to as a first sacrificial pattern 13A, and the remaining portion of the sacrificial layer 13 in the second region B is referred to as a second sacrificial pattern 13B. Also, hereinafter, the remaining portions of the passivation layer 14 in the first region A are referred to as first passivation pattern 14A, and the remaining portion of the passivation layer 14 in the second region B is referred to as second passivation pattern 14B. Thus, the stack structures in the first region A include the first sacrificial pattern 13A and the first passivation pattern 14A, and the stack structure in the second region B includes the second sacrificial pattern 13B and the second passivation pattern 14B.

The photoresist pattern 15 is removed while etching the passivation layer 14 and the sacrificial layer 13. Otherwise, the photoresist pattern 15 may be removed through a separate removal process.

Figure 1C:
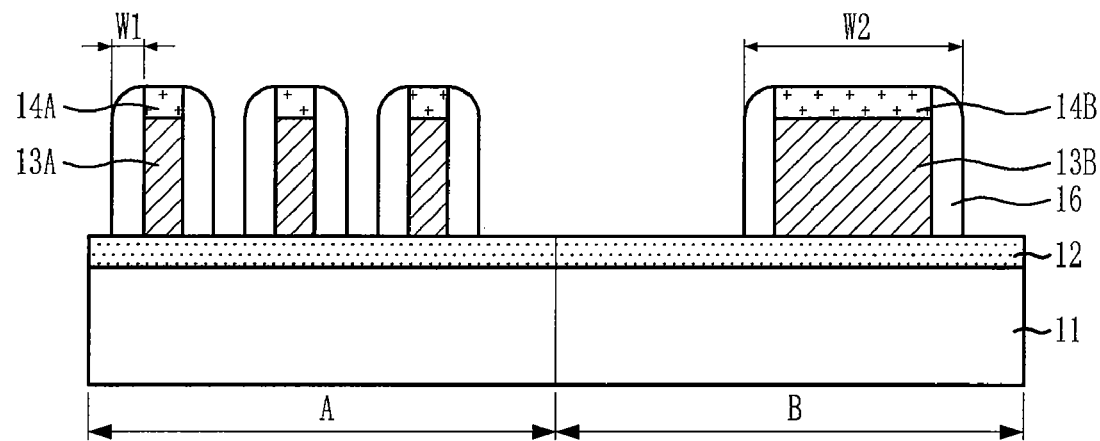

Referring to FIG. 1C, an insulation layer for forming spacers is formed over the resultant structure. A spacer etch process is performed on the insulation layer to form spacers 16 on both sides of the stack structures in the first and second regions A and B.

In this embodiment, the spacers 16 are assumed to include a material different from the first and second sacrificial patterns 13A and 13B. The spacers 16 may include a polysilicon layer or an oxide-based layer.

For instance, when the first and second sacrificial patterns 13A and 13B include a polysilicon layer, the spacers 16 include an oxide-based layer. When the first and second sacrificial patterns 13A and 13B include an oxide-based layer, the spacers 16 include a polysilicon layer.

In particular, the spacers 16 are formed to a thickness that is substantially the same as the first line width W1 of the desired etch-target pattern to be formed in the first region A because a subsequent etch-target pattern formation process is performed using the spacers 16 in the first region A.

Figure 1D:
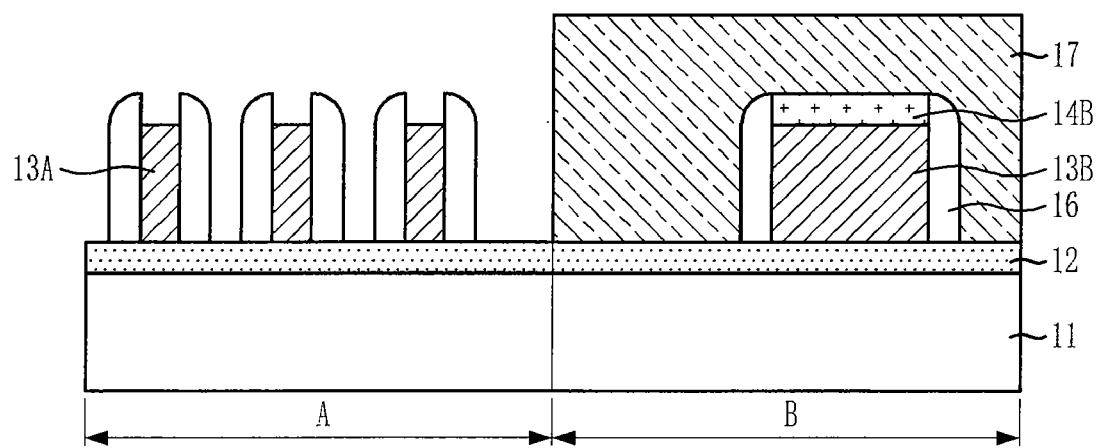

Referring to FIG. 1D, a mask pattern 17 is formed over the second region B. The first passivation pattern 14A exposed in the first region A by the mask pattern 17 is removed. Thus, the first sacrificial pattern 13A in the first region A is exposed.

At this time, if the first and second passivation patterns 14A and 14B include a nitride-based layer, the first passivation pattern 14A is removed through a wet method using phosphoric acid ($H_3PO_4$). If the first and second passivation patterns 14A and 14B include an amorphous carbon layer, a certain layer including a material substantially the same as the first and second sacrificial patterns 13A and 13B is formed over the substrate structure, exposing upper portions of the first passivation pattern 14A in the first region A. The certain layer is formed to a thickness ranging from approximately 50 Å to approximately 200 Å. An ashing process is then performed to remove the first passivation pattern 14A.

The certain layer remaining after removing the passivation pattern 14A may be removed by a separate process or naturally removed in a subsequent process, e.g., a removal process of the mask pattern 17 or a removal process of the first sacrificial pattern 13A.

Figure 1E:
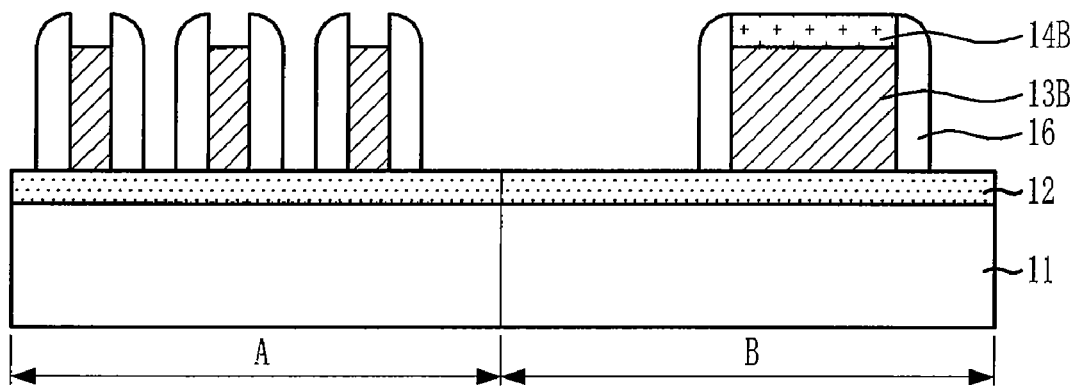

Referring to FIG. 1E, the mask pattern 17 is removed.

Figure 1F:
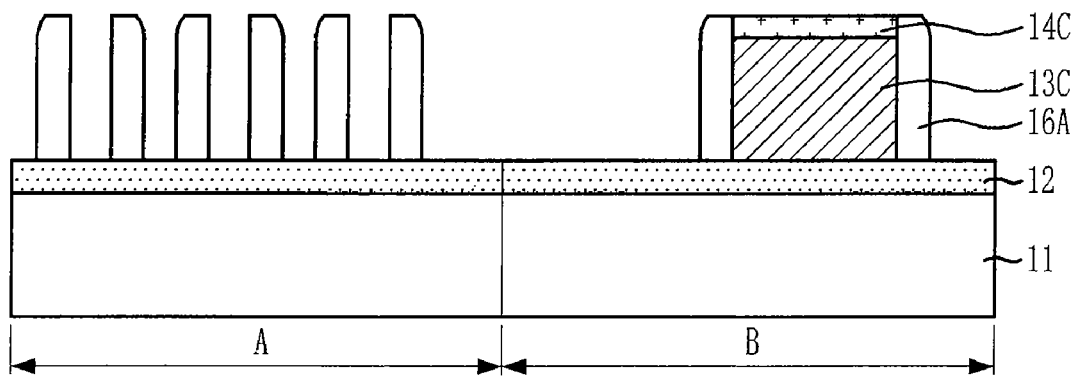

Referring to FIG. 1F, the first sacrificial pattern 13A is removed using a wet or dry method. At this time, the second sacrificial pattern 13B formed in the second region B is not removed because the second sacrificial pattern 13B is protected by the second passivation pattern 14B.

Also, portions of the spacers 16 and the second passivation pattern 14B may be removed while removing the first sacrificial pattern 13A. Reference numerals 16A and 14C represent remaining spacers 16A and a remaining second passivation pattern 14C, respectively.

Consequently, the first region A includes the remaining spacers 16A, whereas the second region B includes the remaining spacers 16A and a stack structure formed between the remaining spacers 16A. The stack structure includes the second sacrificial pattern 13B and the remaining second passivation pattern 14C.

Thus, a positive spacer patterning technology and a negative spacer patterning technology may be applied at substantially the same time during the subsequent etch-target pattern formation process which uses the remaining spacers 16A and the stack structure including the second sacrificial pattern 13B and the remaining second passivation pattern 14C.

The positive spacer patterning technology uses the remaining spacers 16A in the first region A. The negative spacer patterning technology uses the remaining spacers 16A and the stack structure formed between the remaining spacers 16A in the second region B, the stack structure including the second sacrificial pattern 13B and the remaining second passivation pattern 14C.

Figure 1G:
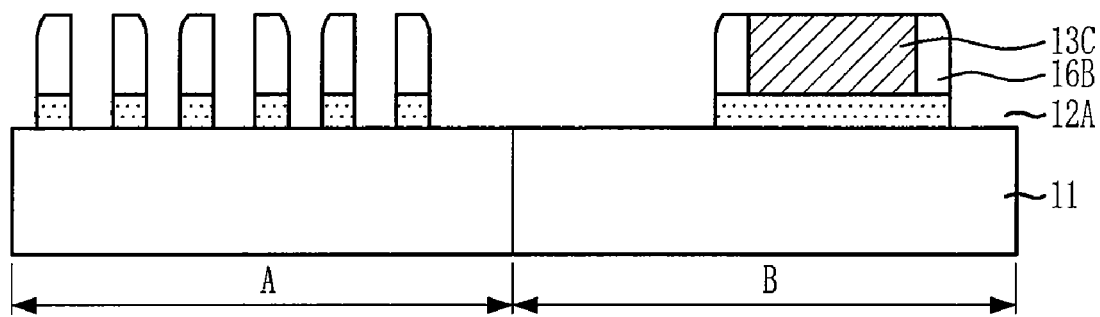

Referring to FIG. 1G, the etch stop layer 12 is etched to form an etch stop pattern 12A using as an etch barrier the remaining spacers 16A in the first region A, the remaining spacers 16A and the stack structure formed between the remaining spacers 16A in the second region B, the stack structure including the second sacrificial pattern 13B and the remaining second passivation pattern 14C.

At this time, portions of the remaining spacers 16A and the second sacrificial pattern 13B may be removed while forming the etch stop pattern 12A. Reference numerals 16B and 13C represent residual spacers 16B and a remaining second sacrificial pattern 13C, respectively. Also, the remaining second passivation pattern 14C may be removed while forming the etch stop pattern 12A.

Figure 1H:
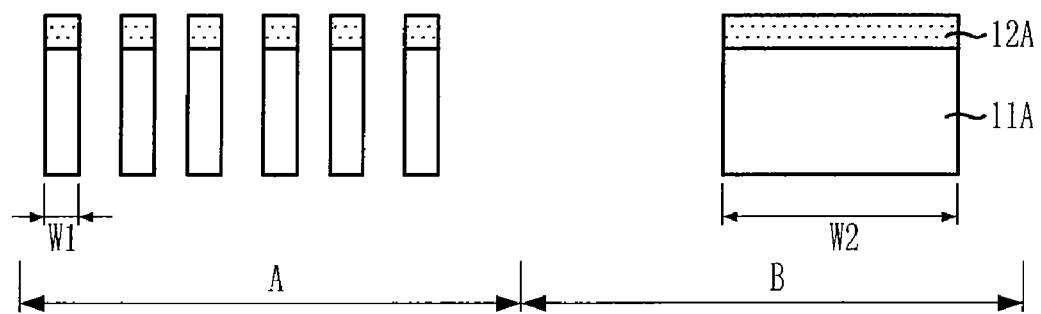

Referring to FIG. 1H, the hard mask 11 is etched to form a hard mask pattern 11A using an etch barrier including the etch stop pattern 12A.

Although not shown in this embodiment, a subsequent process may be performed to etch the etch-target layer using an etch barrier including the hard mask pattern 11A, thus forming an etch-target pattern having the first line width W1 in the first region A and another etch-target pattern having the second line width W2 in the second region B, wherein the second line width W2 is larger than the first line width W1.

While the present invention has been described with respect to the specific embodiments, it will be apparent to those skilled in the art that various changes and modifications may be made without departing from the spirit and scope of the invention as defined in the following claims.

What is claimed is:

1. A method for forming a pattern in a semiconductor device, the method comprising:
   forming an etch-target layer over a substrate, wherein the substrate includes a first region having a first pattern size and a second region having a second pattern size that is larger than the first pattern size;
   forming a sacrificial layer and a passivation layer over the etch-target layer in the first region and the second region;
   etching the passivation layer and the sacrificial layer to form stack structures including a sacrificial pattern and a passivation pattern in the first region and the second region;
   forming spacers against sidewalls of the stack structures in the first region and the second region;
   forming a mask pattern over the sacrificial pattern, the passivation pattern, and the spacers in the second region to cover the second region;
   removing the passivation pattern in the first region by using the mask pattern to expose the sacrificial pattern in the first region;
   removing the exposed sacrificial pattern in the first region; and
   etching the etch-target layer to form an etch-target pattern using the spacers in the first region and the stack structure and the spacers in the second region.

2. The method of claim 1, wherein the first region comprises a cell region and the second region comprises a peripheral region.

3. The method of claim 1, wherein the first region comprises a first area where a plurality of memory cells are to be formed and the second region comprises a second area where a select transistor is to be formed.

4. The method of claim 1, wherein a hard mask and an etch stop layer are formed between the etch-target layer and the sacrificial layer.

5. The method of claim 4, wherein the hard mask comprises an oxide-based layer, an amorphous carbon layer, or a nitride-based layer, or a combination thereof.

6. The method of claim 4, wherein the etch stop layer comprises a silicon oxynitride (SiON) layer.

7. The method of claim 1, wherein the sacrificial layer and the spacers comprise a polysilicon layer or an oxide-based layer, the sacrificial layer and the spacers being of a different material from each other.

8. The method of claim 1, wherein the passivation layer comprises a nitride-based layer, an amorphous carbon layer, or a combination thereof.

9. The method of claim 8, wherein when the passivation pattern comprises a nitride-based layer, removing the passivation pattern in the first region comprises performing a wet etch method using phosphoric acid ($H_3PO_4$).

10. The method of claim 8, when the passivation pattern comprises an amorphous carbon layer, further comprising, before removing the passivation pattern in the first region, forming a material layer over the substrate structure except upper portions of the passivation pattern, the material layer having substantially the same material as the sacrificial pattern, wherein the passivation pattern comprises an amorphous carbon layer.

11. The method of claim 10, wherein removing the passivation pattern in the first region comprises performing an ashing process.

12. The method of claim 1, wherein the spacers are formed to have substantially the same width as a line width of the etch-target pattern in the first region.

13. The method of claim 1, further comprising, after the sacrificial pattern in the first region is exposed, removing the mask pattern.

* * * * *